United States Patent [19]
Ariki et al.

[11] Patent Number: 5,986,964
[45] Date of Patent: Nov. 16, 1999

[54] SEMICONDUCTOR MEMORY DEVICE CONSISTENTLY OPERATING A PLURALITY OF MEMORY CELL ARRAYS DISTRIBUTED IN ARRANGEMENT

[75] Inventors: Takuya Ariki; Takeshi Hamamoto; Kiyohiro Furutani, all of Hyogo, Japan

[73] Assignee: Mitsubishi Denki Kabushiki Kaisha, Tokyo, Japan

[21] Appl. No.: 09/184,010

[22] Filed: Nov. 2, 1998

[51] Int. Cl.$^6$ .................................................. G11C 7/00
[52] U.S. Cl. .............................. 365/230.03; 365/189.05; 365/194; 365/230.06; 365/230.08
[58] Field of Search .................. 365/230.03, 230.06, 365/194, 189.05, 230.08

[56] References Cited

U.S. PATENT DOCUMENTS 5,894,448   4/1999   Amano et al. ................ 365/230.03 X

FOREIGN PATENT DOCUMENTS 4-075377   3/1992   Japan .
4-083496   3/1992   Japan .
6-188699   7/1994   Japan .

*Primary Examiner*—Do Hyun Yoo
*Attorney, Agent, or Firm*—McDermott, Will & Emery

[57] ABSTRACT

A semiconductor memory device of the present invention is provided with a plurality of memory cell arrays distributed and thus arranged and having the same function, and a main control circuit and local control circuits that are structured hierarchically. Each memory cell array has its operation controlled directly by any of the local control circuits, wherein the main control circuit including a command producing circuit which responds to an externally applied signal to produce a control signal corresponding to a predetermined mode of operation, and a global control circuit which responds to a control command to generate a control signal for operating the entire semiconductor memory device consistently. The local control circuits receive the control signal from the global control circuit to cause memory cell arrays to perform a predetermined operation.

14 Claims, 16 Drawing Sheets

SEMICONDUCTOR MEMORY DEVICE CONSISTENTLY OPERATING A PLURALITY OF MEMORY CELL ARRAYS DISTRIBUTED IN ARRANGEMENT

BACKGROUND OF THE INVENTION

1. Field of the Invention

The present invention relates to semiconductor memory devices and more specifically to a configuration of a semiconductor memory device having a plurality of memory cell arrays distributed in arrangement and capable of operating the plurality of memory cell arrays consistently.

2. Description of the Background Art

Recently, as semiconductor memories have larger capacity, there has been the need to provide on one chip a plurality of memory circuits with the same function and operate the circuits consistently.

FIG. 26 is a block diagram showing as one example of such a memory device an entire configuration of a synchronous DRAM (SDRAM) capable of operating eight memory cell arrays having a same function consistently, shown as a conventional semiconductor memory device 100 in the figure.

Referring to FIG. 26, semiconductor memory device 100 is provided with a clock signal terminal 102, an address signal terminal 103, a control signal terminal 104, a data input/output terminal 106, a power supply terminal 108 and a ground potential terminal 109 as input/output terminals for signal communication with the external.

Semiconductor memory device 100 also includes buffer circuits 112–116 provided for signals communicated via input/output terminals, a control circuit 110, a memory cell array 150 and a sense amplifier (SA)-I/O circuit 151, a control signal bus 117 communicating a signal between control circuit 110 and SA-I/O circuit 151, and a data bus 118 for transmitting data between memory cell array 150 and input/output buffer 116.

Control circuit 110 responds to the clock, address and control signals externally applied via input/output terminals 102–104 to produce a control clock corresponding to a predetermined mode of operation and synchronizing with the signals to generally control the operation of semiconductor memory device 100. Control circuit 110 is commonly provided for the eight memory cell arrays and controls the operation of SA-I/O circuit 151 via control signal bus 117 to operate the memory cell arrays with the same function consistently.

However, since the conventional semiconductor memory device 100 has control circuit 110 provided commonly for all of the memory cell arrays, all of the signals required for controlling the operation of each memory cell array need be transmitted via control signal 131. This significantly increases the number of interconnections of control signal bus 117. Thus the load on the signal interconnections is increased and consequently the delay, distortion and the like of a signal is disadvantageously caused and chip area is disadvantageously increased.

SUMMARY OF THE INVENTION

One object of the present invention is to provide a semiconductor memory device capable of more efficiently operating a plurality of memory cell arrays distributed in arrangement consistently.

To sum up the present invention, a semiconductor memory device includes a memory cell array, a main control circuit, a local control circuit, and a control signal bus.

The memory cell array is divided into and arranged as a first plurality of memory cell blocks.

The main control circuit is provided commonly for the first plurality of memory cell blocks, and includes a command producing circuit responsive to an externally applied signal to produce a predetermined command, and a global control circuit responsive to a command to activate a command activation signal and responsive to the activated command activation signal to activate an auxiliary command signal for a first predetermined period of time.

The local control circuit is provided for each memory cell block and controls the operation of the corresponding memory cell block.

The local control circuit responds to activation of the command activation signal transmitted from the global control circuit to activate a command execution signal and perform an operation designated by the command activation signal in the corresponding memory cell block and the local control circuit responds to the end of the designated operation to inactivate the command execution signal.

The control signal bus communicates a signal between the global control circuit and the local control circuit.

The global control circuit responds to inactivation of the command execution signal from each local control circuit and to inactivation of the auxiliary command signal to inactivate the command activation signal.

Therefore a main advantage of the present invention is that a semiconductor memory device can be provided capable of consistently operating a plurality of memory cell arrays distributed in arrangement, with a reduced number of signal interconnections.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
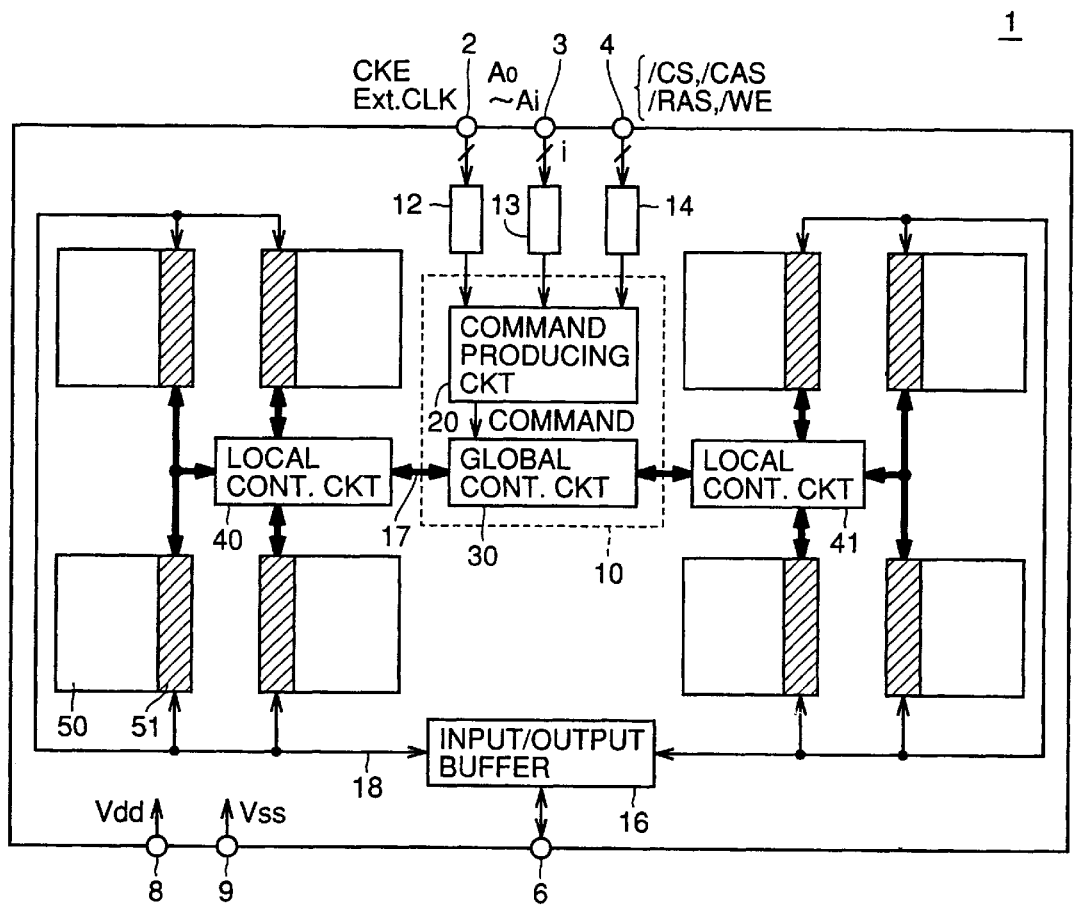
FIG. 1 is a block diagram showing an entire configuration of a semiconductor memory device 1 according to a first embodiment of the present invention.

Hereinafter the embodiments of the present invention will now be specifically described with reference to the drawings. The same reference characters in the figures denote identical or corresponding portions.

First Embodiment

FIG. 1 is a block diagram showing as one example of the first embodiment of the present invention an entire configuration of a synchronous DRAM (SDRAM) capable of consistently operating eight memory cell arrays having the same function, shown as a semiconductor memory device 1 in the figure.

It should be noted while in the embodiments described below the configuration and operation of a semiconductor memory device will be described using an SDRAM as an example, the semiconductor memory device of the present invention is not limited to the so-called SDRAM, as will be apparent from the description provided hereinafter.

Referring to FIG. 1, semiconductor memory device 1 includes a clock terminal 2 receiving a clock enable signal CKE and an external clock signal Ext.CLK, an address terminal 3 receiving address signals A0–Ai, a control signal terminal 4 receiving a chip select signal /CS, a column address strobe signal /RAS, a column address strobe signal /CAS and a write enable signal /WE, a data terminal 6 inputting/outputting data, a power supply terminal 8 receiving a power supply potential, and a ground terminal 9 receiving a ground potential, as terminals transmitting and receiving signals to and from the external.

Semiconductor memory device 1 also includes buffer circuits 12–14 provided between clock signal, address signal and control signal terminals 2, 3 and 4 and a global control circuit 10, and an input/output buffer 16 provided for data terminal 6 for amplifying input and output signals.

Semiconductor memory device 1 has eight memory cell arrays divided into two blocks, and a control circuit provided to have a hierarchical structure configured of main control circuit 10 and a local control circuit 40, 41 provided for each block of memory cell arrays. The eight memory cell arrays arranged in semiconductor memory device 1 are each configured of a memory cell array 50 and a SA-I/O circuit 51.

Main control circuit 10 includes a command producing circuit 20 which responds to the external signals received from signal terminals 2–4 via buffer circuits 12–14 to produce a command corresponding to a predetermined mode of operation that is synchronized with the external signals, and a global control circuit 30 which responds to the command signal to issue a command to local control circuit 40, 41 to operate the entire semiconductor memory device consistently.

Local control circuit 40, 41 receives the command from global control circuit 30 to control memory cell array 50 via SA-I/O circuit 51.

Memory cell array 50 has a plurality of memory cells arranged in a matrix. SA-I/O circuit 51 includes a sense amplifier which amplifies the data of a memory cell, a driver which drives the word and column lines corresponding to a selected address to a selected state, a control circuit for controlling an I/O line for data communication with the external, and the like.

Semiconductor memory device 1 also includes a control signal bus 18 for signal communication between global control circuit 30 and SA-I/O circuit 51, and a data bus 17 for transmitting the data between the memory cell array 50 and input/output buffer 16.

Thus, semiconductor memory device 1 has each memory cell array 50 controlled by global control 30 and local control circuit 40, 41 to provide a predetermined operation depending on a command signal produced in command producing circuit 20 within main control circuit 10 in response to externally applied clock, address and control signals, and semiconductor memory device 1 transmits and receives data to and from the external at data terminal 6 via input/output buffer 16 as required.

Semiconductor memory device 1 with a control circuit having a hierarchical structure configured of main control circuit 10 directly receiving an externally applied command to produce a command applied inside a chip and of local control circuit 40, 41 receiving a control signal from the main control circuit to actually issue a command to memory cell arrays, can reduce the number of the interconnections of control signal bus 17 and overcome the disadvantages associated with an otherwise increased number of the interconnections that are described above.

A specific configuration and operation of the control circuit will now be described, taking as an example an auto-refresh operation (also referred to as AUTOREF hereinafter) which is successively effected automatically when neither data read nor write commands are issued to the semiconductor memory device.

While in the embodiments described hereinafter the auto-refresh operation is exemplified to describe a configuration and operation of the control circuit as a component of the present invention, the semiconductor memory device of the present invention can be applicable to not only a command for the auto-refresh operation but any commands required for operating a plurality of memory cell arrays consistently, as will be apparent hereinafter.

Figure 2:
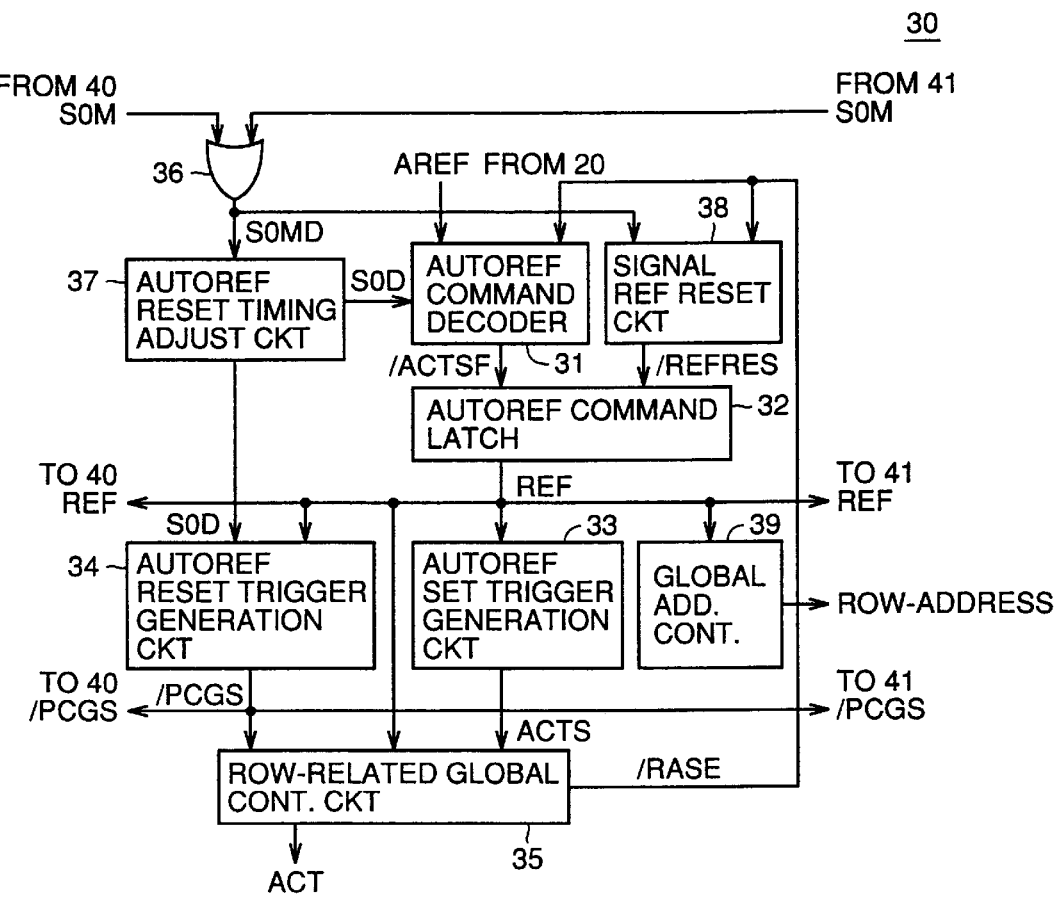
FIG. 2 is a block diagram showing an entire configuration of a global control circuit 30.

FIG. 2 is a block diagram showing an entire configuration of global control circuit 30 for providing the auto-refresh operation.

Referring to FIG. 2, global control circuit 30 includes an AUTOREF command decoder 31 receiving an auto-refresh command AREF from command producing circuit 20 to allow an auto-refresh command detection pulse /ACTSF to attain an active low level, and an AUTOREF command latch circuit 32 receiving auto-refresh command detection pulse /ACTSF and an auto-refresh reset signal /REFRES and generating an auto-refresh activation signal REF which determines the activation period of the auto-refresh operation. Signal REF is transmitted to local control circuit 40, 41 via control signal bus 17.

Global control circuit 30 also includes an AUTOREF set trigger generation circuit 33 which detects a low-to-high transition of signal REF to generate an auto-refresh set trigger ACTS of one-shot pulse, a global address control circuit 39 which responds to an activated signal REF to produce a row address for auto-refreshing, an AUTOREF reset trigger generation circuit 34 which generates a row-related operation reset signal /PCGS, a row-related global control circuit 35 which generates a row-related operation activating signal /RASE which attains an active low level in response to an activated auto-refresh set trigger signal ACTS and attains an inactive high level in response to an activated row-related operation reset signal /PCGS, and an AUTOREF reset circuit 38 generating an auto-refresh reset signal /REFRES depending on the state of signal /RASE and the state of a sense amplifier activating flag SOMD generated in response to a sense amplifier activating signal SOM for each memory cell array.

A logic gate 36 included in global control circuit 30 produces sense amplifier activation flag SOMD obtained as an OR of sense amplifier activation signal SOM in each memory cell array. Sense amplifier activation SOMD is transmitted to signal REF reset circuit 38. Once signal REF is activated, signal REF reset circuit 38 responds to an inactivation of a row-related operation or signal /RASE of inactive high level and to inactivation of a sense amplifier in each memory cell array or sense amplifier activation flag SOMD of inactive low level to allow auto-refresh reset signal /REFRES to attain an active high level to inactivate auto-refresh activation signal REF.

Global control circuit 30 also includes an adjust circuit 37 for adjusting the timing at which the AUTOREF operation is reset. Adjust circuit 37 receives sense amplifier activation flag SOMD, ensures a sufficient time for the row-related operation and then allows a delayed version SOD of signal SOMD to attain an active high level to reset the row-related operation. Signal SOD is supplied to AUTOREF reset trigger generation circuit 34 to provide a timing of activation of signal /PCGS.

Global address control circuit 39 also responds to the activated signal REF to produce a row address signal designating a subject to be auto-refreshed and transmit the row address signal to the local control circuit.

Figure 3:
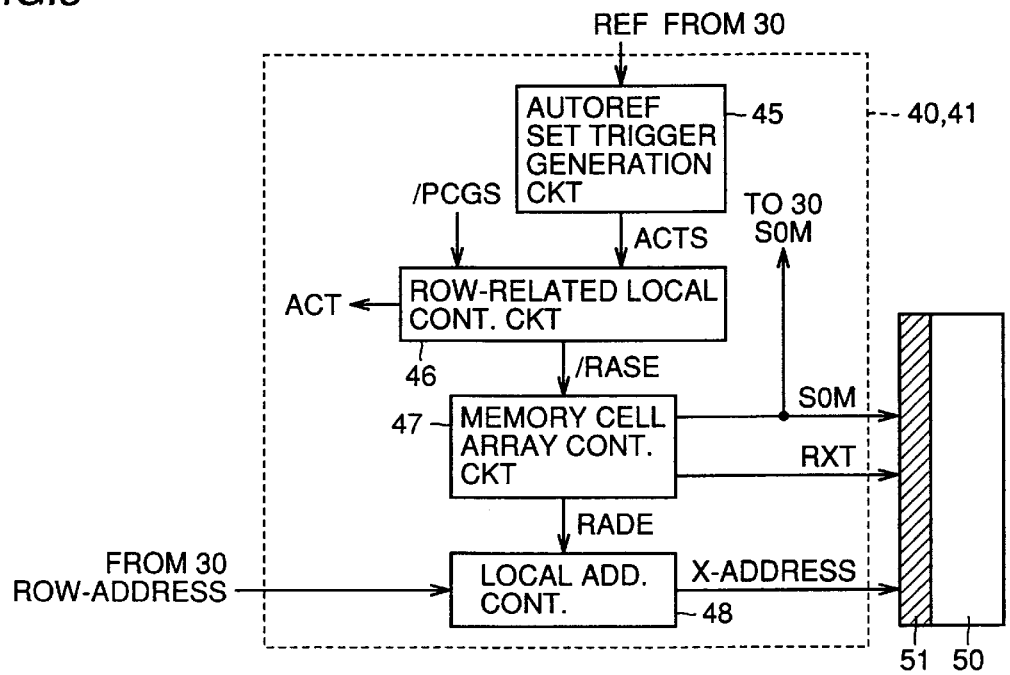
FIG. 3 is a block diagram showing an entire configuration of a local control circuit 40, 41.

A configuration of local control circuit 40, 41 will now be described. FIG. 3 is a block diagram showing an entire configuration of local control circuit 40, 41.

Referring to FIG. 3, local control circuit 40, 41, includes an AUTOREF set trigger generation circuit 45 which receives signal REF from global control circuit 30 to generate auto-refresh set trigger ACTS for the local control circuit, and a row-related local control circuit 46 which receives signal ACTS transmitted from AUTOREF set trigger generation circuit 45 and row-related operation reset signal /PCGS transmitted from global control circuit 30 to control the row-related operation within the coverage of each local control circuit.

Row-related local control circuit 46 generates row-related operation activating signal /RASE which is effective within the coverage of each local control circuit. AUTOREF set trigger generation circuit 33 and row-related local control circuit 46 are identical in configuration and function to the AUTOREF set trigger generation circuit 45 and row-related global control circuit 35 of the global control circuit.

Thus, auto-refresh activation signal REF and row-related operation reset signal /PCGS that are shared by global control circuit 30 and local control circuit 40, 41, and row-related local control circuit 46 that responds to the shared auto-refresh activation signal REF and row-related operation reset signal /PCGS to control the row-related operation in each local control independently, can eliminate the conventional disadvantage that the number of the interconnections of control signal bus 17 is increased.

Local control circuit 40, 41 also includes a memory cell array control circuit 47 and a local address control circuit 48. Memory cell array control circuit 47 receives row-related operation activating signal /RASE and transmits sense amplifier activation signal SOM and a word-line activation signal RXT to SA-I/O circuit 51. Similarly, local address control circuit 48 receives a row address hold signal RADE transmitted from an auxiliary row-related, local control circuit 47 and a row address signal transmitted from global address control circuit 39 and transmits an address X of interest to SA-I/O circuit 51.

Figure 4:
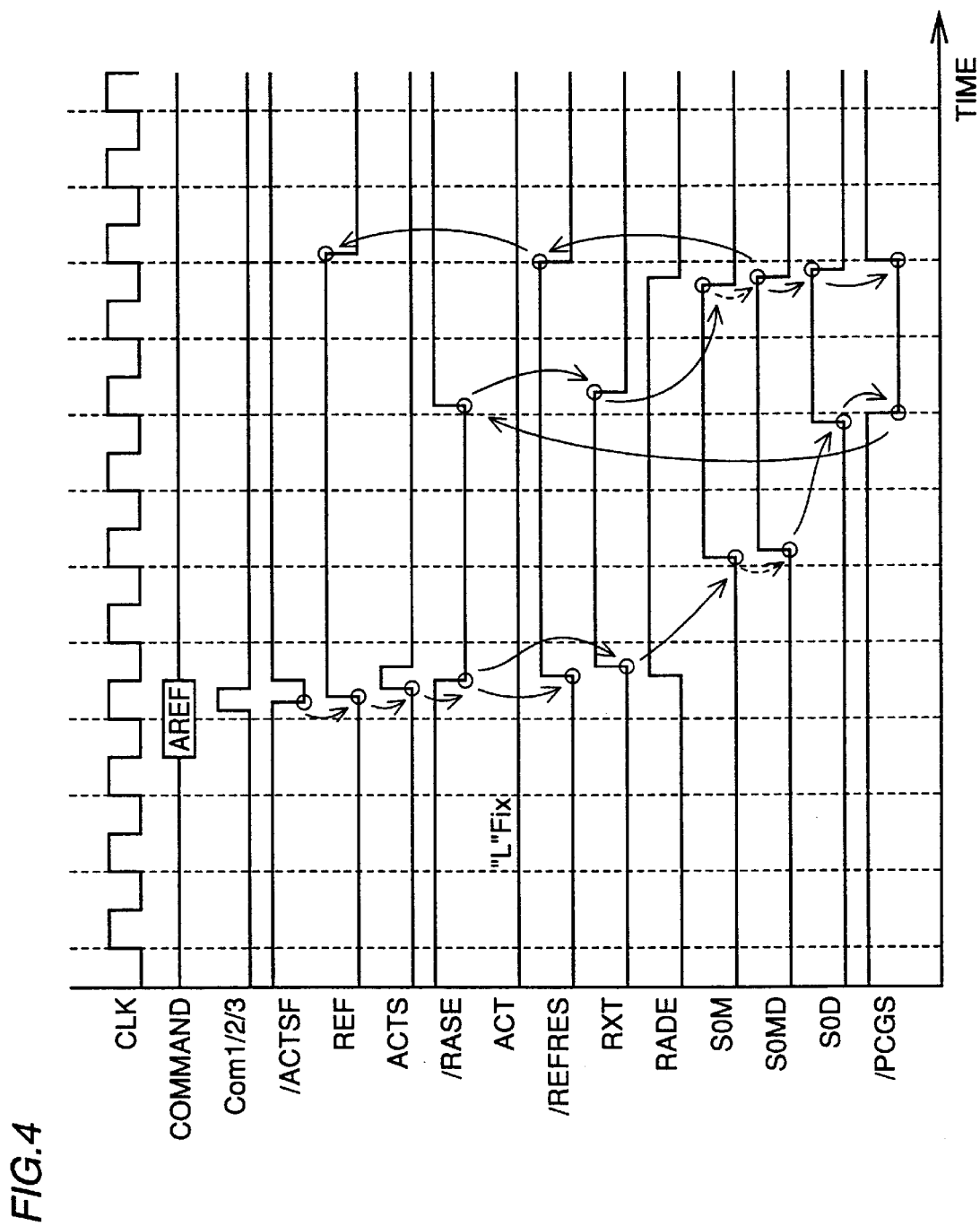
FIG. 4 is a waveform diagram representing respective transitions of various signals of global control circuit 30 and local control circuit 40, 41.

FIG. 4 is a waveform diagram representing a transition of each signal of global control circuit 30 and local control circuit 40, 41.

Referring to FIG. 4, a clock signal CMK is a master clock signal of a synchronous DRAM. When command producing circuit 20 produces auto-refresh command AREF depending on a combination of the external control signals, AUTOREF command decoder 31 initially confirms that the row-related operation or signal /RASE is placed in an inactive state and AUTOREF command recorder 31 then issues auto-refresh command detection pulse /ACTSF. AUTOREF command latch circuit 32 responds to auto-refresh command detection pulse /ACTSF of active low level to allow auto-refresh activation signal REF to attain an active high level. In response to the low-to-high transition of auto-refresh activation signal REF, AUTOREF set trigger generation circuit 33 generates auto-refresh set trigger ACTS of one-shot pulse. In response to the generation of auto-refresh set trigger ACTS, row-related global control circuit 35 causes row-related operation activating signal /RASE to attain an active low level. Simultaneously it fixes column-associated operation activating signal ACT at an inactive low level.

In local control circuit 40, 41 also, a similar operation is effected in AUTOREF set trigger generation circuit 45 and row-related local control circuit 46 to activate the row-related operation activating signal /RASE for the local control circuit. Responsively, word-line activating signal RXT and sense amplifier activating signal SOM are activated, and auto-refreshing is actually effected in memory cell array 50 via SA-I/O circuit 51.

The activation of sense amplifier activating signal SOM in each local control circuit allows an output from logic gate 36 in global control circuit 30, i.e. sense amplifier activation flag SOMD, to attain an active high level. Furthermore, signal SOD obtained by delaying sense amplifier activation flag SOMD is provided by adjust circuit 37. At the timing of a low-to-high transition of signal SOD when a predetermined period of time has elapsed since a low-to-high transition of sense amplifier activation flag SOMD, AUTOREF reset trigger generation circuit 34 causes row-related operation reset signal /PCGS to attain an active low level. The row-related operation reset signal PCGS of active low level causes row-related operation activating signal /RASE to attain an inactive high level. In other words, row-related operation activating signal /RASE is inactivated when a predetermined delay time provided by adjust circuit 37 has elapsed since activation of sense amplifier activation flag SOMD.

The row-related operation activating signal /RASE of inactive high level results in word-line activating signal RXT and sense amplifier activating signal SOM successively attaining an inactive low level.

The sense amplifier activating signal SOM inactivated in each local control circuit 40, 41 causes sense amplifier activation flag SOMD to attain an inactive low level. Depending on the timing of inactivation of sense amplifier activation flag SOMD after row-related operation activating signal /RASE is inactivated, signal REF reset circuit 38 causes auto-refresh reset signal /REFRES to attain an active low level. In response to the signal /REFRES of active low level, AUTOREF command latch circuit 32 causes the signal REF that has been placed in the high-level active state to attain an inactive low level. Thus one auto-refresh operation completes.

Similarly, in response to the sense amplifier activation flag SOMD of inactive low level, adjust circuit 37 inactivates signal SOD and responsively AUTOREF reset trigger generation circuit 34 causes row-related operation reset signal /PCGS to again attain an inactive high level.

When this state is achieved, an auto-refresh operation is normally completed and another auto-refresh operation can normally be started for the next auto-refresh command AREF newly input.

Thus, signal REF determining the activation period of the auto-refresh operation is activated in response to generation of a command signal transmitted from command producing circuit 20 (or to activation of one-shot pulse /ACTSF). Once signal REF is activated, signal REF is inactivated when it is recognized that a row-related operation is completed in the global control circuit (or signal /RASE is inactivated) and activation of a sense amplifier is not effected as an operating state of each local control circuit (or signal SOMD is inactivated).

Specific Configuration of Each Circuit.

The configurations of various circuits included in global control circuit 30 and local control circuit 40, 41 will now be described more specifically.

Figure 5:
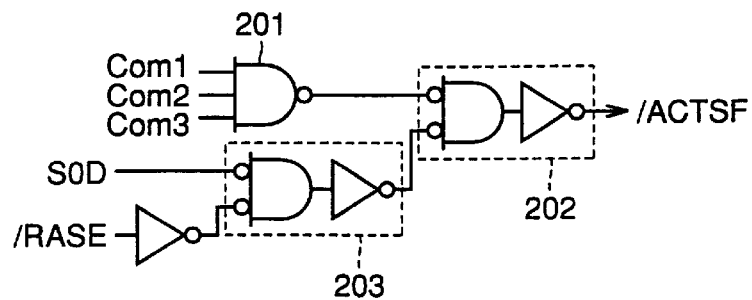
FIG. 5 is a circuit diagram showing a specific configuration of an AUTOREF command decoder 31.

FIG. 5 is a circuit diagram showing a specific configuration of AUTOREF command recorder 31.

Referring to FIG. 5, AUTOREF command recorder 31 includes an NAND gate 201 receiving Com1-3 of one-shot pulse generated in response to auto-refresh command AREF, an OR operation circuit 203 having two inputs respectively receiving signal SOD transmitted from adjust circuit 37 and an inverted version of row-related operation activating signal /RASE, and an OR operation circuit 202 having two inputs respectively receiving an output signal from NAND gate 201 and an output signal from OR operation circuit 203. An output from OR operation circuit 202 serves as auto-refresh command detection pulse /ACTSF.

That is, when auto-refresh command AREF is received, AUTOREF command decoder 31 allows the state of signal SOD and the state of row-related operation activating signal /RASE to be reflected for confirming that the row-related operation is not activated, and thus generates auto-refresh command detection pulse /ACTSF.

Figure 6:
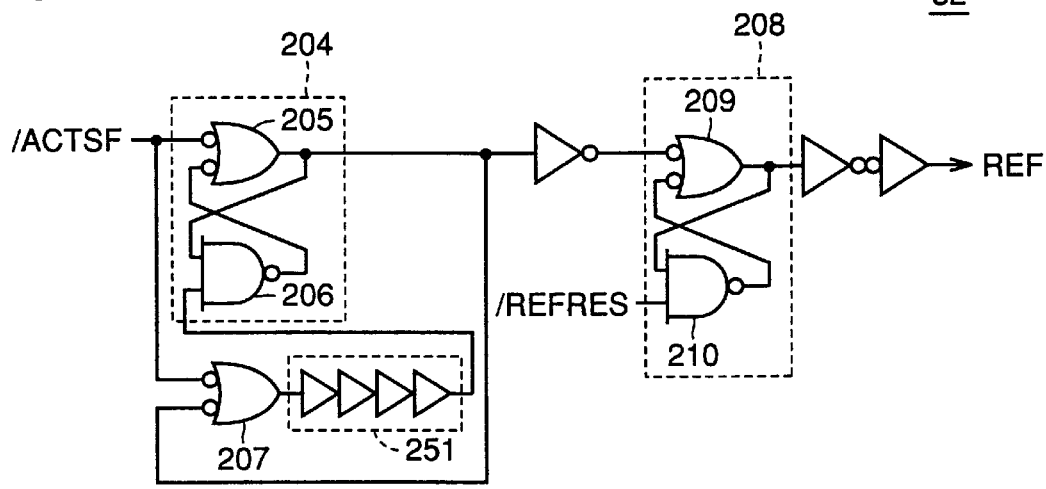
FIG. 6 is a circuit diagram showing a specific configuration of an AUTOREF command latch circuit 32.

FIG. 6 is a circuit diagram showing a specific configuration of AUTOREF command latch circuit 32. Referring to FIG. 6, AUTOREF command latch circuit 32 includes an SR flip-flop 204 configured of logic gates 205 and 206. SR flip-flop 204 receives auto-refresh command detection pulse /ACTSF as a reset input and SR flip-flop 204 receives a delayed signal from a delay circuit 251 as a reset input. The delayed signal from a delay circuit 251 is a delayed version of an output from logic gate 207 that is an NAND of signal /ACTSF and a feed-back signal of an output from SR flip-flop 204.

AUTOREF command latch circuit 32 also includes logic gates 209 and 210 configuring an SR flip-flop 208 having the two inputs respectively receiving an inverted version of the output from SR flip-flop 204 as a set input and auto-refresh reset signal /REFRES as a reset input. Auto-refresh activation signal REF is produced from an output from SR flip-flop 208.

Auto-refresh activation signal REF attains an active high level in response to a low-to-high transition of auto-refresh command detection pulse /ACTSF. Once signal REF is activated, signal REF attains an inactive low level responsively when auto-refresh reset signal /REFRES attains an active low level.

Figure 7:
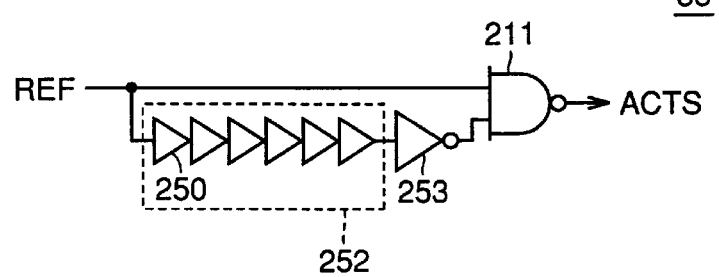
FIG. 7 is a circuit diagram showing a specific configuration of an AUTOREF set trigger generation circuit 33.

FIG. 7 is a circuit diagram showing a specific configuration of AUTOREF set trigger generation circuit 33.

Referring to FIG. 7, AUTOREF set trigger generation circuit 33 includes a delay circuit 252 which delays auto-refresh activation signal REF, and an inverter 253 which inverts an output from delay circuit 252. Delay circuit 252 has a delay element 250. Auto-refresh set trigger generation circuit 33 also includes an NAND gate 211 having two inputs receiving signal REF and an output from inverter 253. An output from NAND gate 211 selves as one-shot pulse ACTS. Thus AUTOREF set trigger generation circuit 33 detects a low-to-high transition of auto-refresh activation signal/REF and thus generates one-shot pulse ACTS.

Figure 8:
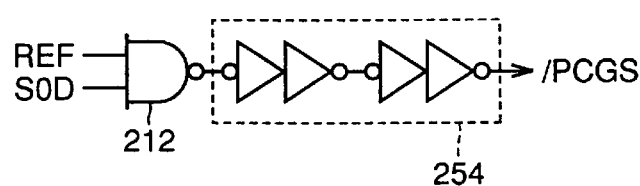
FIG. 8 is a circuit diagram showing a specific configuration of an AUTOREF reset trigger generation circuit 34.

FIG. 8 shows a specific configuration of auto-refresh reset trigger generation circuit 34.

Referring to FIG. 8, auto-refresh reset trigger generation circuit 34 includes an NAND gate 212 having two inputs receiving auto-refresh activation signal REF and signal SOD, and a delay circuit 254. Signal /PCGS is produced from an output of a delay circuit 254. Thus, during an activation period of auto-refresh activation signal REF, AUTOREF reset trigger generation circuit 34 causes row-related operation reset signal /PCGS to attain an active low level in response to a low-to-high transition of signal SOD generated when a predetermined delay time has elapsed since a low-to-high transition of sense amplifier activation flag SOMD.

Figure 9:
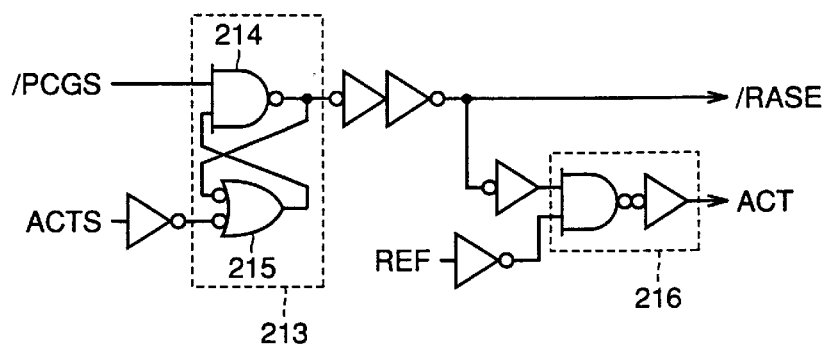
FIG. 9 is a circuit diagram showing a specific configuration of a row-related global control circuit 35.

FIG. 9 is a circuit diagram showing a specific configuration of row-related global control circuit 35.

Referring to FIG. 9, row-related global control circuit 35 includes logic gates 214 and 215 configuring an SR flip-flop 213 having two inputs receiving row-related operation reset signal /PCGS as a set input and an inverted version of auto-refresh set trigger ACTS as a reset input, and a logical operation circuit 216 outputting an AND of an inverted version of an output signal from SR flip-flop 213 and an inverted version of auto-refresh activation signal REF as signal ACT. Thus, row-related global control circuit 35 responds to generation of auto-refresh set trigger ACTS to allow row-related operation activating signal /RASE to attain an active low level and responds to row-related operation reset signal /PCGS of active low level to allow the once activated /RASE to attain an inactive high level.

During the activation period of auto-refresh activation signal REF, column-associated operation activating signal ACT is fixed at inactive low level.

Figure 10:
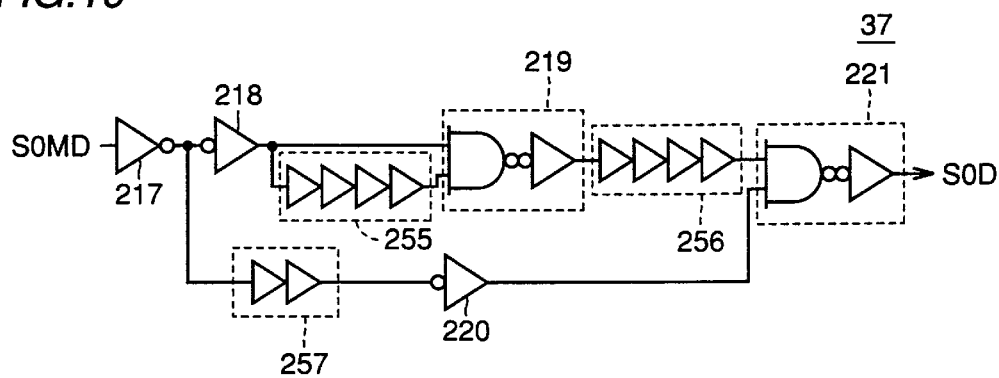
FIG. 10 is a circuit diagram showing a specific configuration of an adjust circuit 37.

FIG. 10 is a circuit diagram showing a specific configuration of adjust circuit 37.

Adjust circuit 37 shown in FIG. 10 includes an inverter 217 which inverts sense amplifier activation flag SOMD, an inverter 218 which inverts an output from inverter 217, and an AND operation circuit 218 having two inputs receiving an output from inverter 217 and an output obtained by delaying the output from inverter 218 by means of delay circuit 255.

Adjust circuit 37 also includes a delay circuit 257 which delays the output from inverter 217, an inverter 220 which inverts an output from delay circuit 257, a delay circuit 256 which delays an output from logical operation circuit 219, and an AND operation circuit 221 having two inputs receiving an output from delay circuit 256 and an output from inverter 220. An output of AND operation circuit 221 serves as signal SOD.

Adjust circuit 37 receives sense amplifier activation flag SOMD and outputs the delayed version SOD of flag SOMD, although there is a significant difference between the delay time provided depending on the timing at which signal SOMD rises and that provided depending on the timing at which signal SOMD falls. More specifically, for the timing at which signal SOMD rise, the delay time between signals SOD and SOMD is determined by delay circuits 255 and 256. For the timing at which signal SOMD falls, the delay time between signals SOD and SOMD is provided by delay circuit 257. Thus, signal SOD is significantly delayed relative to sense amplifier activation flag SOMD for the timing at which signal SOMD rises, and signal SOD is slightly delayed relative to sense amplifier activation flag SOMD for the timing at which signal SOMD falls.

Figure 11:
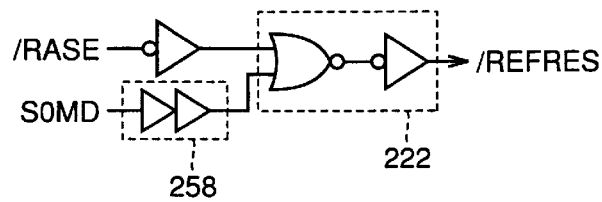
FIG. 11 is a circuit diagram showing a specific configuration of a REF-signal resetting circuit 38.

FIG. 11 is a circuit diagram showing a specific configuration of signal REF reset circuit 38.

Referring to FIG. 11, signal REF reset circuit 38 includes an OR operation circuit 222 having two inputs receiving an inverted version of row-related operation activating signal /RASE and an output from a delay circuit 258 or an inverted version of sense amplifier activation flag SOMD. An output of OR operation circuit 222 serves as signal /REFRES.

When row-related operation activating signal /RASE attains an inactive high level or a row-related operation is inactivated and sense amplifier activation flag SOMD attains an inactive low level or a sense amplifier of each memory cell array completes its operation to complete a refresh operation and is placed in an inactive state, signal REF reset circuit 38 allows auto-refresh reset signal /REFRES indicative of inactivation of auto-refresh activation signal REF to attain an active low level.

Figure 12:
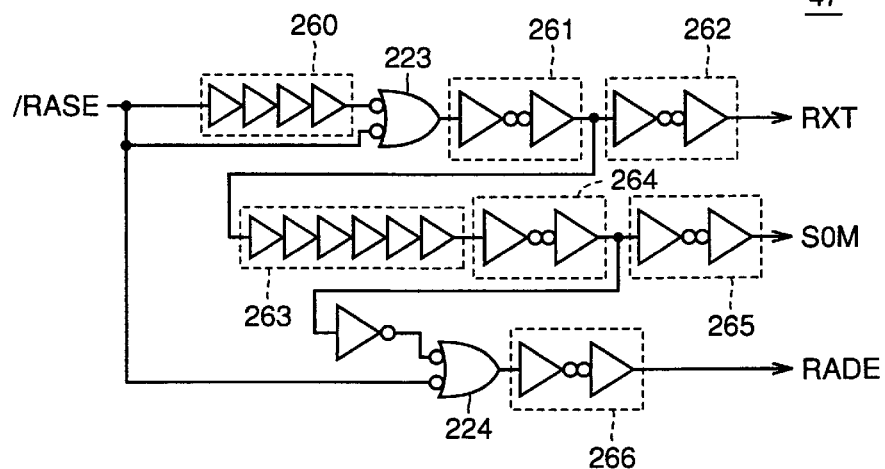
FIG. 12 is a circuit diagram showing a specific configuration of a memory cell array control circuit 47.

FIG. 12 is a circuit diagram showing a specific configuration of memory cell array control circuit 47.

Referring to FIG. 12, memory cell array control circuit 47 receives the row-related operation activating signal /RASE for the local control circuit that is generated in each local control circuit by AUTOREF set trigger generation circuit 45 and row-related local control circuit 46 depending on signal REF transmitted from global control circuit 30 and memory cell array control circuit 47 thus produces word-line activating signal RXT, sense amplifier activating signal SOM and auxiliary row-address signal RADE.

Memory cell array control circuit 47 includes a delay circuit 260 which delays row-related operation activating signal /RASE, and a logic gate 223 having two inputs receiving signal /RASE and an output from delay circuit 260. An output from logic gate 223 is provided as word-line activating signal RXT via delay circuits 261 and 262. Row-related local control circuit 47 includes delay circuits 263, 264 and 265 receiving and further delaying an output from delay circuit 261. An output from delay circuit 265 serves as sense amplifier activating signal SOM. Thus, sense amplifier activating signal SOM is activated at a timing provided after word-line activating signal RXT is activated. Row-related local control circuit 47 further includes a logic gate 224 having two inputs receiving an inverted version of an output signal from delay circuit 264 and signal /RASE to output an NOR thereof, and a delay circuit which delays the output from logic gate 224. An output from delay circuit 266 is transmitted as address X hold signal RADE to SA-I/O circuit 51.

Thus, semiconductor memory device 1 according to the first embodiment has its control circuit having a hierarchical structure configured of a global control circuit and a local control circuit. The global control circuit produces and accepts commands and generates a command activation signal such as auto-refresh activation signal REF, while each local control circuit also generates auto-refresh set trigger ATCS serving as a trigger to actually start a command and responds to signal ACTS to independently effect a command operation.

Thus a plurality of memory cell arrays distributed in arrangement can be operated consistently without increasing the number of the interconnections of control signal bus 17.

Second Embodiment

The second embodiment contemplates more stable operation by considering a configuration of a semiconductor memory device capable of preventing any inconsistency in its operation that is caused by the effects of a signal deformed while auto-refresh activation signal REF shared by global and local control circuits is transmitted on a control signal bus.

For semiconductor memory device 1 according to the first embodiment, auto-refresh set trigger generation circuit 45 included in each local control circuit can inconsistently operate depending on the degree of the deformation of a signal caused in transmitting the signal on control signal bus 17. This phenomenon will now be described with reference to FIG. 13.

Figure 13:
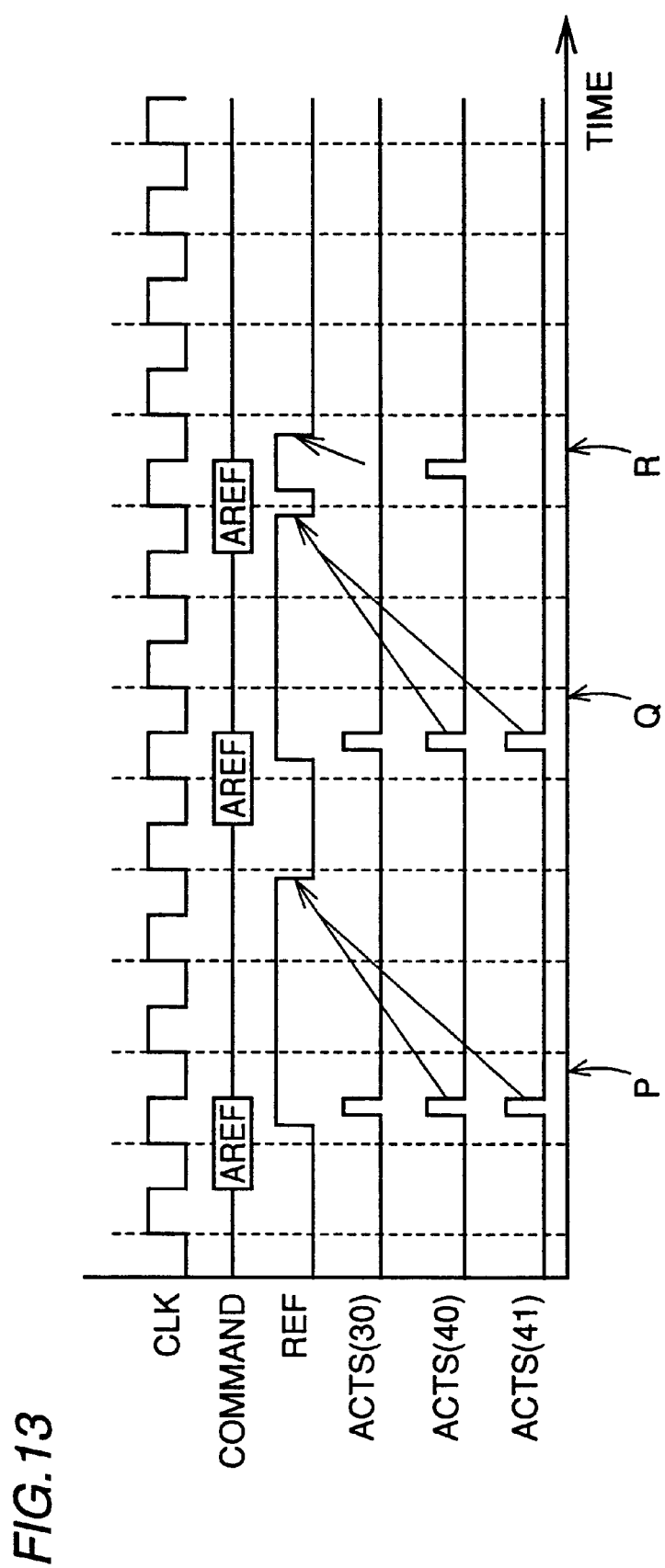
FIG. 13 is a view for illustrating a relation between signal REF and the generation of signal ACTS in each control circuit.

FIG. 13 is a diagram for illustrating a relation between auto-refresh activation signal REF and generation of auto-refresh set trigger ACTS in each control circuit.

In the figure, ACTS (30) represents a signal ATCS generated in global control circuit 30, and ACTS (40) and ACTS (41) similarly represent signals ACTS respectively generated in local control circuits 40 and 41.

Referring to FIG. 13, a command is determined for each cycle of clock signal CLK and auto-refresh command REF is produced depending on the states of control signals. For each of timings P and Q, command AREF is generated with a relatively sufficient time provided between a refresh operation and the subsequent refresh operation. Thus auto-refresh set trigger generation circuit 33, 45 in each control circuit operates normally and the global control circuit and each local control circuit all generate refresh-signal set trigger ACTS normally.

For a timing R, however, there is not provided a sufficient time between a refresh operation and the subsequent refresh operation and signal REF prior to generation of command AREF thus has a short period of inactive state.

Activation of refresh-signal set trigger ACTS is triggered when signal REF rises. Thus, for the case as described above, a signal deformed on control signal bus 17 or any variation in the characteristics of the circuit elements of the auto-refresh set trigger circuits can disadvantageously prevent a low-to-high transition of signal REF from being detected satisfactorily in all of the circuits. This can disadvantageously result in one circuit succeeding in generation of trigger signal ACTS and another circuit failing to generate trigger signal ACTS.

FIG. 13 exemplarily shows that for command AREF, global control circuit 30 and local control circuit 41 fail to generate trigger signal ACTS, whereas local control circuit 40 only generates signal ACTS.

If such an inconsistency is caused in signal generation, local control circuit 40 starts a refresh operation, whereas global control circuit 30 fails to generate signal ACTS and fails to recognize the refresh operation so that row-related global control circuit 35 fails to activate row-related operation activating signal /RASE. As a result, signal REF reset circuit 38 operates to reset the common, auto-refresh activation signal REF in spite that local control circuit 40 is executing the refresh operation. Such an inconsistent operation can destroy data of memory cells and thus result in unstable, general operation of the semiconductor memory device.

In order to overcome this disadvantage, the second embodiment contemplates a configuration of a semiconductor memory device capable of generating an auto-refresh set trigger ACTS that prevents any inconsistent operation that is attributed to auto-refresh activation signal REF commonly used in the global and local control circuits.

Figures 14, 15:
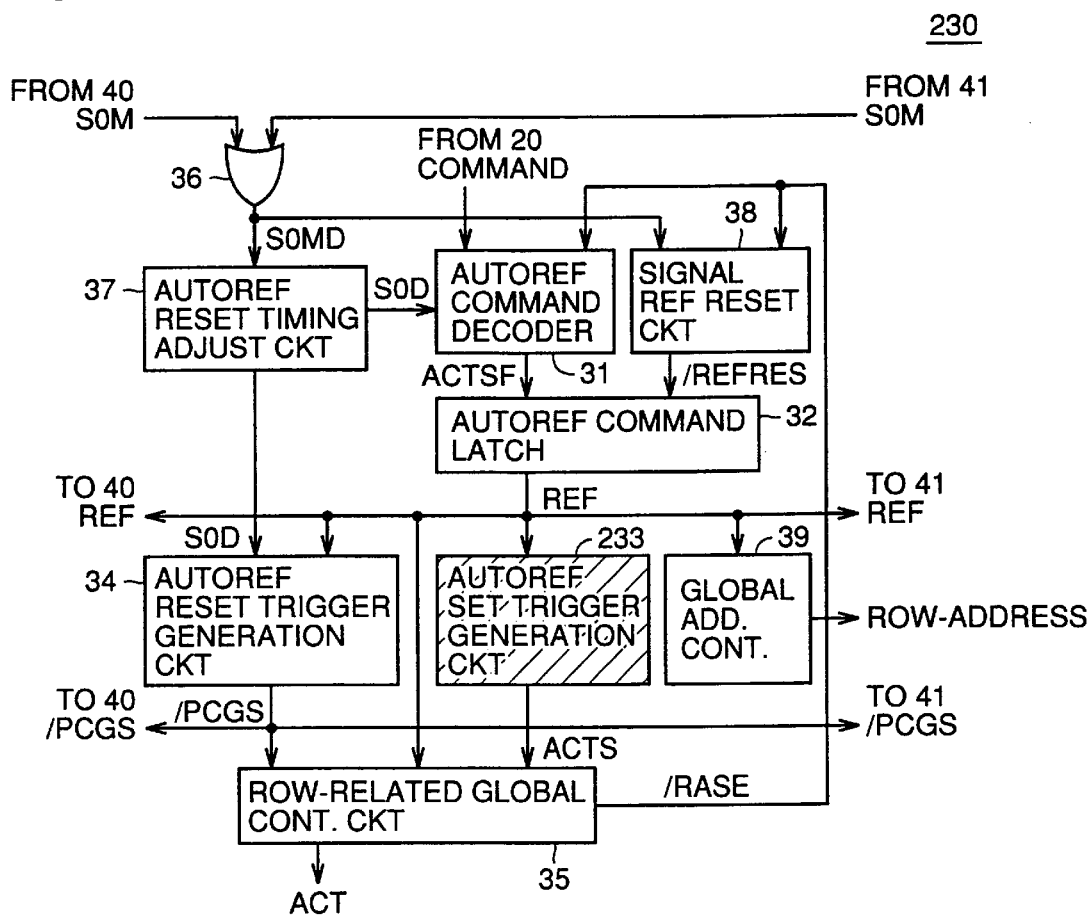
FIG. 14 is a block diagram showing an entire configuration of a global control circuit 230 according to a second embodiment.
FIG. 15 is a block diagram showing an entire configuration of a local control circuit 240, 241 according to the second embodiment.

FIGS. 14 and 15 show a configuration of a global control circuit 230 and that of a local control circuit 240, 241 of a semiconductor memory device according to the second embodiment of the present invention.

The second embodiment is characterized in that an AUTOREF set trigger generation circuit 233 included in global control circuit 230 and an AUTOREF set trigger generation circuit 245 included in local control circuit 240, 241 are different in sensitivity level.

The rest of the configuration is similar to that of the configuration in the first embodiment and a description thereof will not be repeated.

As has been described above, an insufficient period of time between auto-refresh commands and the resultant, extremely short period of time between an inactivation of signal REF and the subsequent activation thereof under a command AREF newly issued (referred to as an inactivation period TL hereinafter) might result in inconsistent signal generation, when the varying generation of signal ACTS is disadvantageous. Accordingly, such a design is considered that each auto-refresh set trigger generation circuit has a different minimal inactivation period TL required (referred to as TLmin hereinafter) to detect a low-to-high transition of signal REF and normally generate signal ACTS.

More specifically, AUTOREF set trigger generation circuit 233 included in global control circuit 230 is designed to be smaller in TLmin or higher in signal detection sensitivity than AUTOREF set trigger generation circuit 245 included in each local control circuit 40, 41. This can eliminate the effects of any variation in the circuit elements configuring each auto-refresh set trigger signal generation circuit, a signal deformed in signal REF transfer and the like to generate signal ACTS at least in global control circuit 230.

While global control circuit 230 does not actually control memory cell array 50, global control circuit 230 activates signal REF in response to a generated command and provides a timing to reset signal REF in response to signal ACTS generated uniquely in the global control circuit depending on the activated signal REF. Since global control circuit 230 depends on local control circuit 240, 241 to generate a signal which controls the general operation of the semiconductor memory device, ensuring that signal ACTS is generated in global control circuit 230 can prevent the entire semiconductor memory device from operating inconsistently if the operation of the AUTOREF set trigger generation circuit varies between the control circuits and ACTS generation is thus inconsistent.

The circuit configuration of auto-refresh set trigger generation circuit 233, 234 of the second embodiment is similar to that according to the first embodiment that is shown in FIG. 7, except for the design of a delay element 250 configuring a delay circuit 252 between the global and local control circuits.

Figure 16:
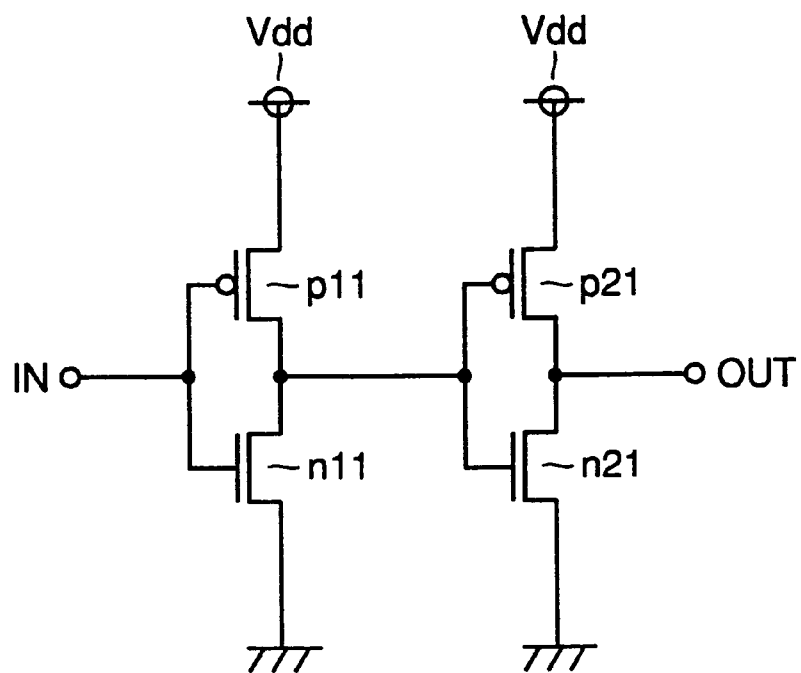
FIG. 16 is a circuit diagram showing a configuration of a delay element 250 according to the second embodiment.

FIG. 16 is a circuit diagram showing a configuration of delay element 250 according to the second embodiment. Delay element 250 shown in FIG. 16 has pairs of p11 and n11 and of p21 and n21, each pair forming an inverter. In the second embodiment, each transistor configuring the inverters has a different characteristic between the global and local control circuits.

Figure 17:
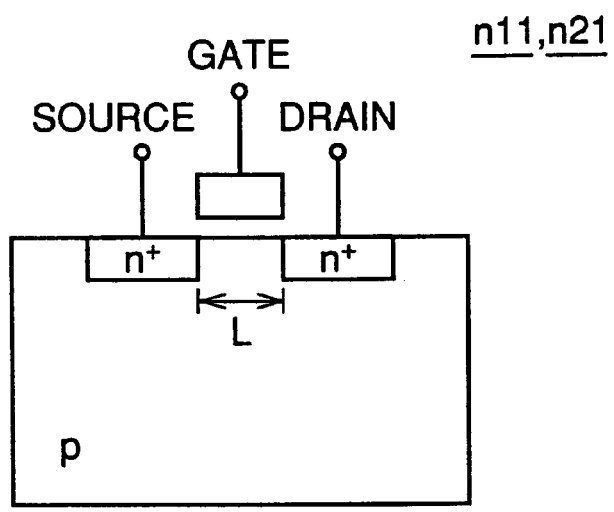
FIG. 17 is a schematic diagram showing a configuration of a transistor n11, n21 configuring delay element 250.

FIG. 17 is a conceptual view exemplarily showing a configuration of n-type transistor n12, 21 among the transistors configuring the inverters.

Referring to FIG. 17, the length of the region exactly under the gate between the source and drain regions is generally referred to as a channel length L. According to the second embodiment, the channel length of the transistors used for the local control circuit is designed to be different from that of the transistors used for the global control circuit.

More specifically, the channel length of a transistor configuring delay element 250 included in AUTOREF set trigger circuit 33 in global control circuit 230 is designed to be shorter than that of a transistor configuring delay element 250 included in AUTOREF set trigger generation circuit 45 in the local control circuit.

The reduced channel length of the transistors configuring the inverters included in the delay element allows a transmitted signal to pass through a delay stage in sharp waveform and thus the TLmin described above to be reduced. Thus, detection sensitivity can be improved.

While as has been described with reference to FIGS. 16 and 17, channel length L of the transistors configuring delay element 250 is varied between the global and local control circuits, the delay time provided by delay circuit 252 configured of delay element 250 is designed to be the same between the both circuits. Thus, in the normal operation each auto-refresh set trigger circuit can generate signal ACTS at the same timing, and if an auto-refresh command is generated without at an inappropriate timing, ensuring that signal ACTS is generated at least in the global control circuit can prevent inconsistent, general operation of the semiconductor memory device.

Figure 18:
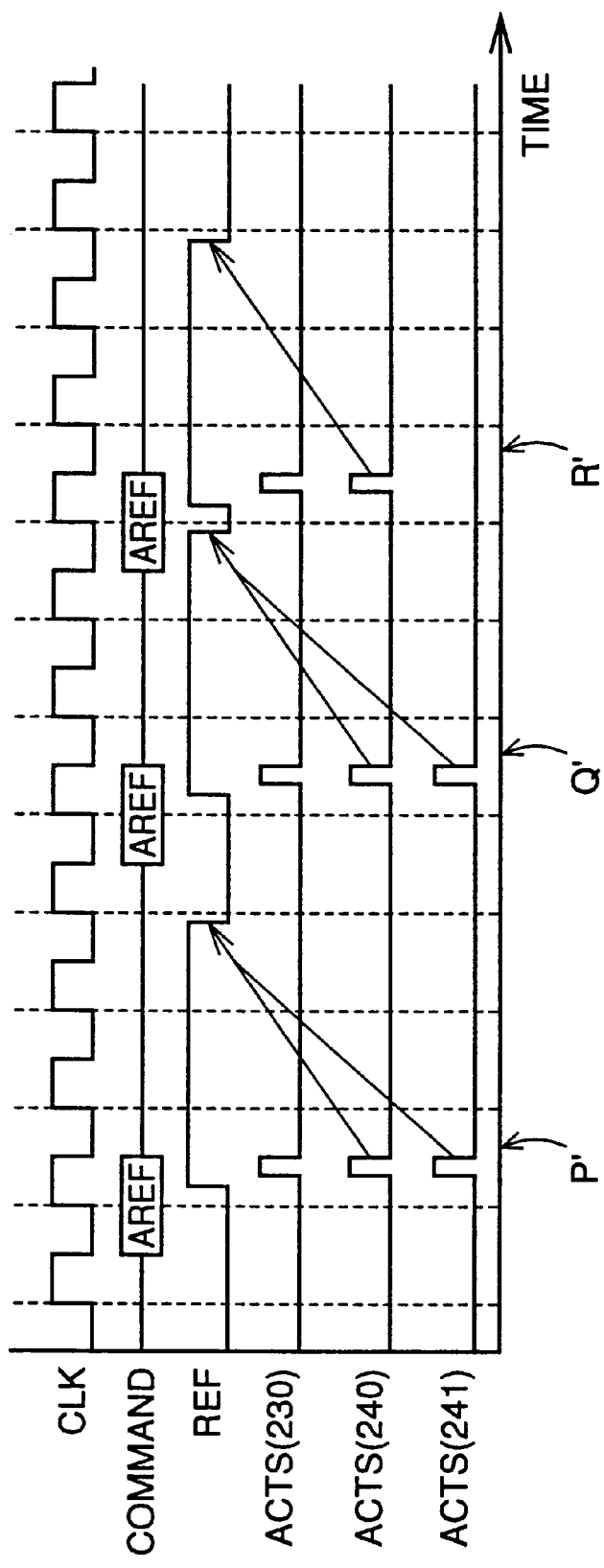
FIG. 18 is a view for illustrating a relation between signal REF and the generation of signal ACTS in each control circuit in the second embodiment.

FIG. 18 represents a relation between auto-refresh activation signal REF and generation of ACTS in each control circuit in the second embodiment. In the figure, ACTS (230) represents signal ATCS generated in global control circuit 230 and similarly ACTS (240) and ACTS (241) represent signals ACTS generated in local control circuits 240 and 241, respectively.

Figure 19:
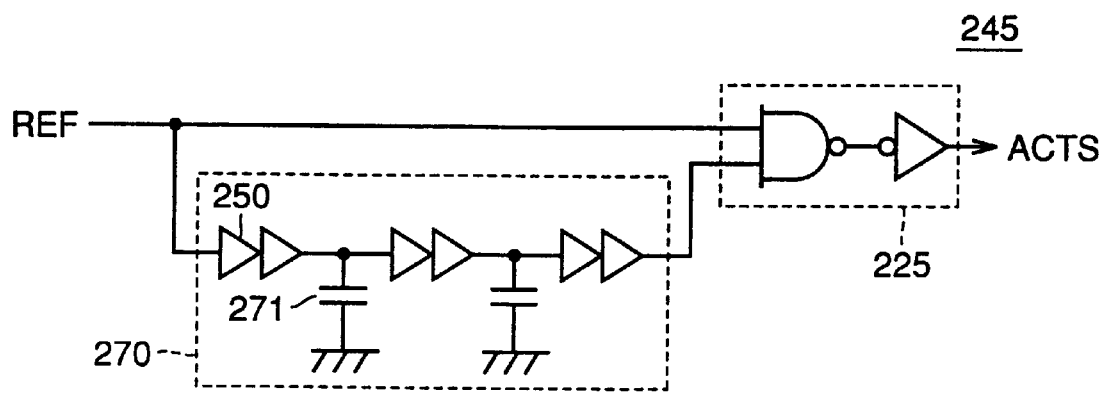
FIG. 19 is a circuit diagram showing a specific configuration of an AUTOREF set trigger generation circuit 245 of a local control circuit as a variation of the second embodiment of the present invention.

Referring to FIG. 19, if in the second embodiment an auto-refresh signal is again generated at a timing R' without a sufficient time provided, the detection sensitivity that is varied between the AUTOREF set trigger generation circuits can prevent the disadvantage that while the local control circuit providing the actual refresh operation generates signal ACTS, the global control circuit fails to generate signal ACTS.

Thus, if an inconsistency in the generation of signal ACTS is caused between local control circuits 240 and 241, as is shown for timing R', global control 230 with higher detection sensitivity surely generates signal ACTS. This prevents the disadvantage described with reference to FIG. 13 that signal REF is immediately inactivated due to the influence of global control circuit 230 and signal REF is inactivated normally in response to completion of an auto-refresh operation in local control circuit 240. Thus the semiconductor memory device can avoid inconsistent general operation.

Variation of the Second Embodiment

FIG. 19 is a circuit diagram showing a configuration of AUTOREF set trigger generation circuit 245 included in local control circuit 240, 241 in a variation of the second embodiment.

AUTOREF set trigger generation circuit 245 shown in FIG. 19 includes a logical operation circuit 225 which outputs an AND of signal REF and a signal from delay circuit 270 that is a delayed version of signal REF. An output of logical operation circuit 225 serves as signal ACTS.

The rest of the configuration is similar to that of the configuration according to the second embodiment and a description thereof will not be repeated.

Delay circuit 207 includes delay element 250 and a capacitor 271. More specifically, AUTOREF set trigger generation circuit 45 in the variation of the second embodiment is provided with delay circuit 270 including delay element 250 plus capacitor 271. By contrast, the configuration of auto-refresh set trigger generation circuit 33 of global control circuit 230 is as shown in FIG. 7 and the delay circuit does not include a capacitor.

Thus the addition of a capacitor only to the delay circuit of AUTOREF set trigger generation circuit 245 in the local control circuit can provide the same effect as provided by the increased channel length of the transistors configuring delay element 250 in the second embodiment, i.e. by deforming a signal passing through delay circuit 270 the detection sensitivity of AUTOREF set trigger generation circuit 233 can be set higher than that of AUTOREF set trigger generation circuit 245.

Third Embodiment

In the third embodiment, the general operation of a semiconductor memory device is further stabilized by adding a function to surely reset an once activated auto-refresh activation signal REF after a predetermined period of time.

According to the second embodiment, the detection sensitivity of AUTOREF set trigger generation circuit 233 of global control circuit 230 can be set higher than that of AUTOREF set trigger generation circuit 245 included in local control circuit 240, 241 to overcome the disadvantage that ACTS is generated only in the local control circuit and an auto-refresh operation once started is thus immediately inactivated.

However, there might be caused a disadvantage that only global control circuit 230 generates ACTS while local control circuit 240, 241 actually controlling the memory cell array fails to generate signal ACTS.

Figure 20:
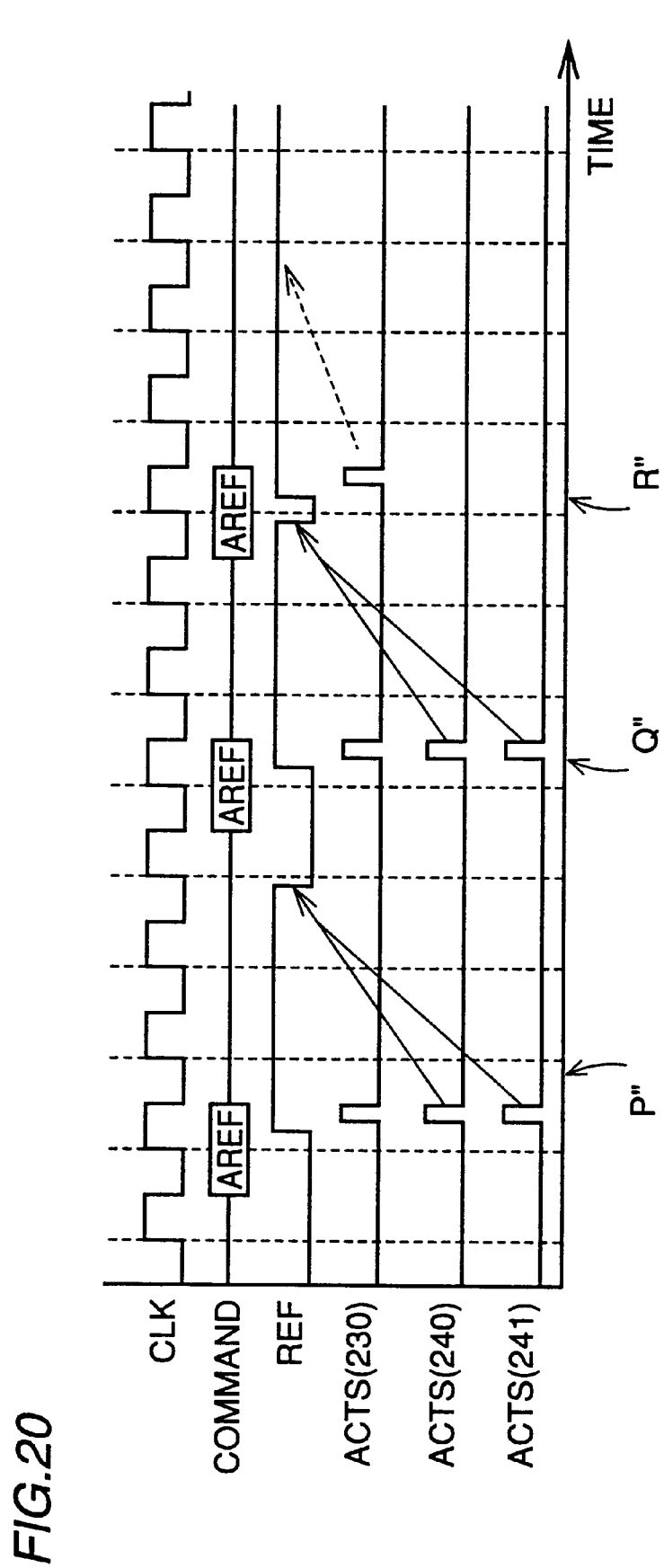
FIG. 20 is a view for illustrating a disadvantage when an inconsistency is caused in the generation of signal ACTS between the control circuits with respect to signal REF.

FIG. 20 represents a relation between auto-refresh activation signal REF and generation of auto-refresh set trigger ACTS in each control circuit when the disadvantage described above is caused.

Figure 21:
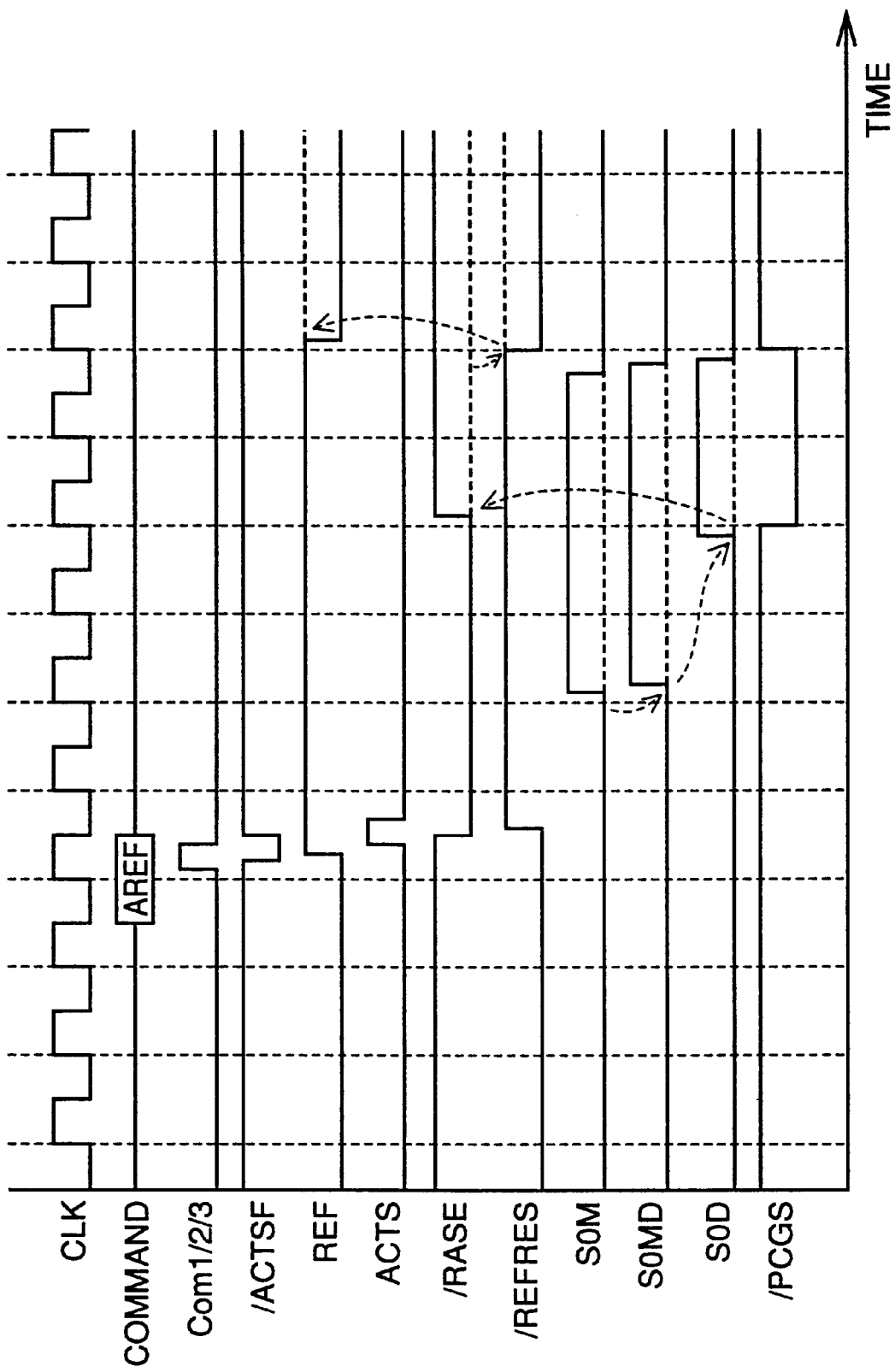
FIG. 21 is a waveform diagram of each signal in global control circuit 230, for illustrating the disadvantage.

FIG. 21 is a waveform diagram of each signal in global control circuit 230, for describing the problem described above.

Referring to FIG. 20, for a timing R", command AREF is not provided with a sufficient time provided since the immediately preceding refresh operation and the signal REF prior to the generation of command AREF has a reduced period of inactivation state. Thus, global control circuit 230 generates signal ACTS, whereas local control circuit 240, 241 does not generate signal ACTS.

In this case, as shown in FIG. 21, in local control circuit 240, 241 sense amplifier activating signal SOM is not activated as represented in broken line and sense amplifier activation flag SOMD is also fixed in an inactive state as represented in broken line.

Thus, signal REF reset circuit 38 cannot obtain a trigger to activate signal /REFRES as represented in broken line. This results in an disadvantage that a refresh activation signal RES once generated cannot be reset as represented in broken line.

In this condition, it might be impossible to provide the subsequent auto-refresh operation.

Figure 22:
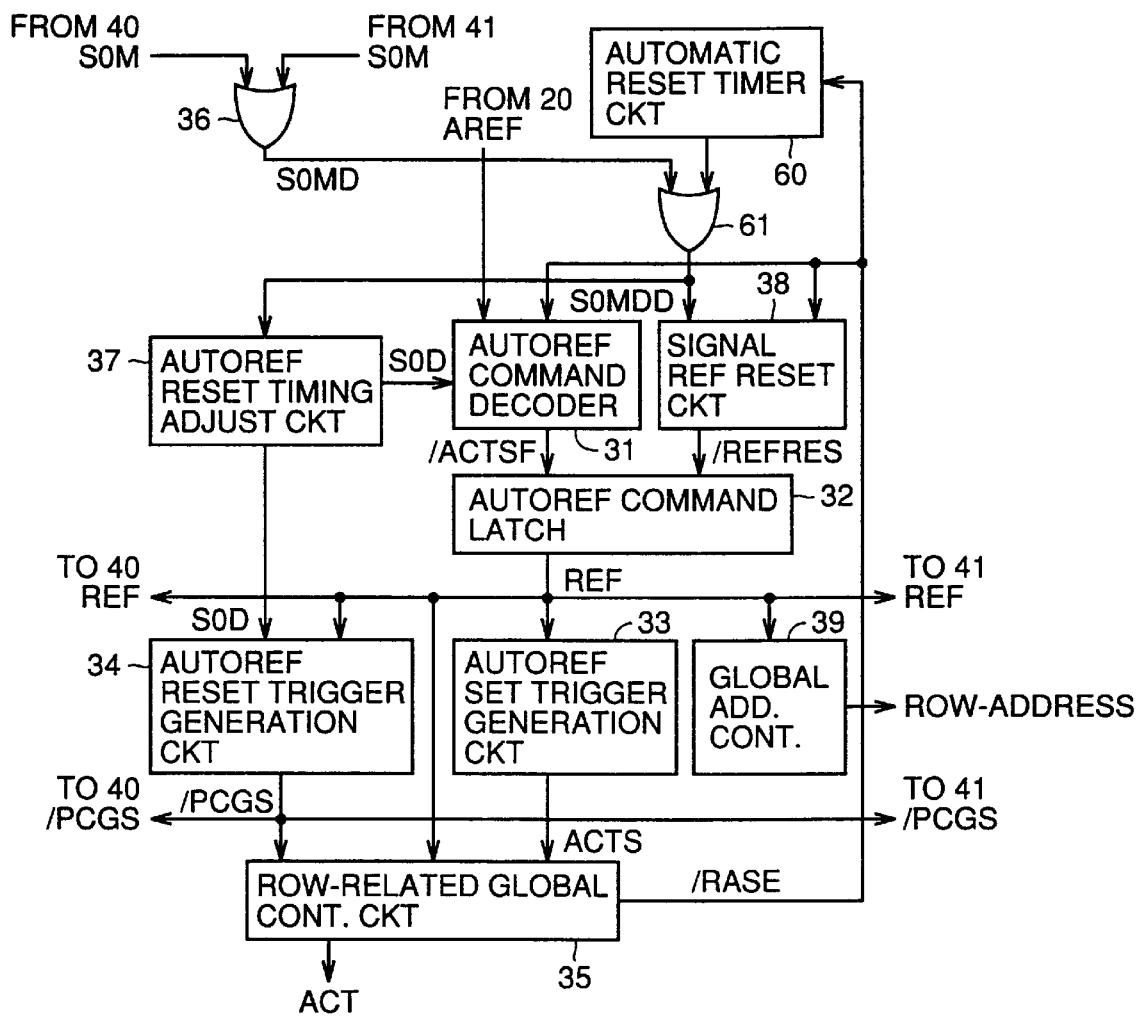
FIG. 22 is a block diagram showing an entire configuration of a global control circuit 330 according to a third embodiment of the present invention.

FIG. 22 is a block diagram showing an entire configuration of a global control circuit 330 according to a third embodiment of the present invention.

Referring to FIG. 22, global control circuit 330 according to the third embodiment differs from global control circuit 30 according to the first embodiment in that it further includes an automatic reset timer 60 receiving row-related operation activating signal /RASE and outputting a delay signal RASED, and a logic gate 61 outputting an OR of signal RASED and sense amplifier activation flag SOMD.

The rest of the configuration according to the third embodiment is similar to that of the configuration according to the second embodiment and a description thereof will not be repeated.

Figure 23:
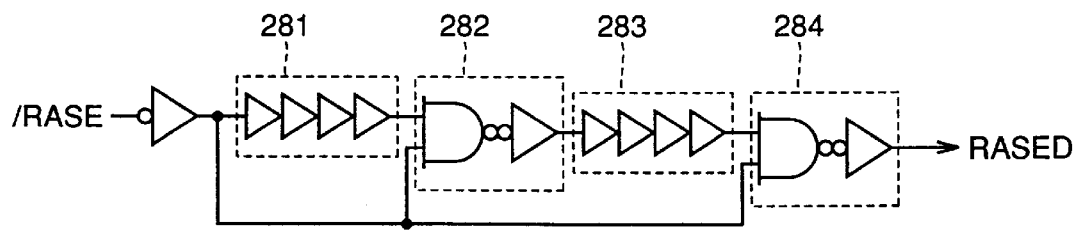
FIG. 23 is a circuit diagram showing a specific configuration of an automatic reset timer circuit 60.

FIG. 23 is a circuit diagram showing a specific configuration of automatic reset timer circuit 60. Automatic reset timer circuit 60 shown in FIG. 23 includes a delay circuit 281 receiving signal /RASE and delaying an inverted version thereof, a logic gate 282 having two inputs receiving an output from delay circuit 281 and the inverted version of signal /RASE and outputting an AND thereof, a delay circuit 283 delaying an output from logic gate 282, and a logic operation circuit 284 outputting an AND of an output from delay circuit 283 and the inverted version of signal /RASE.

An output from logic operation circuit 284 or RASED is signal /RASED inverted and delayed for a predetermined period of time.

For global control circuit 330, the disadvantage described above is overcome by providing an OR signal of an output from automatic refresh timer circuit 60 and sense amplifier activation flag SMD as one input to signal REF reset circuit 38.

Figure 24:
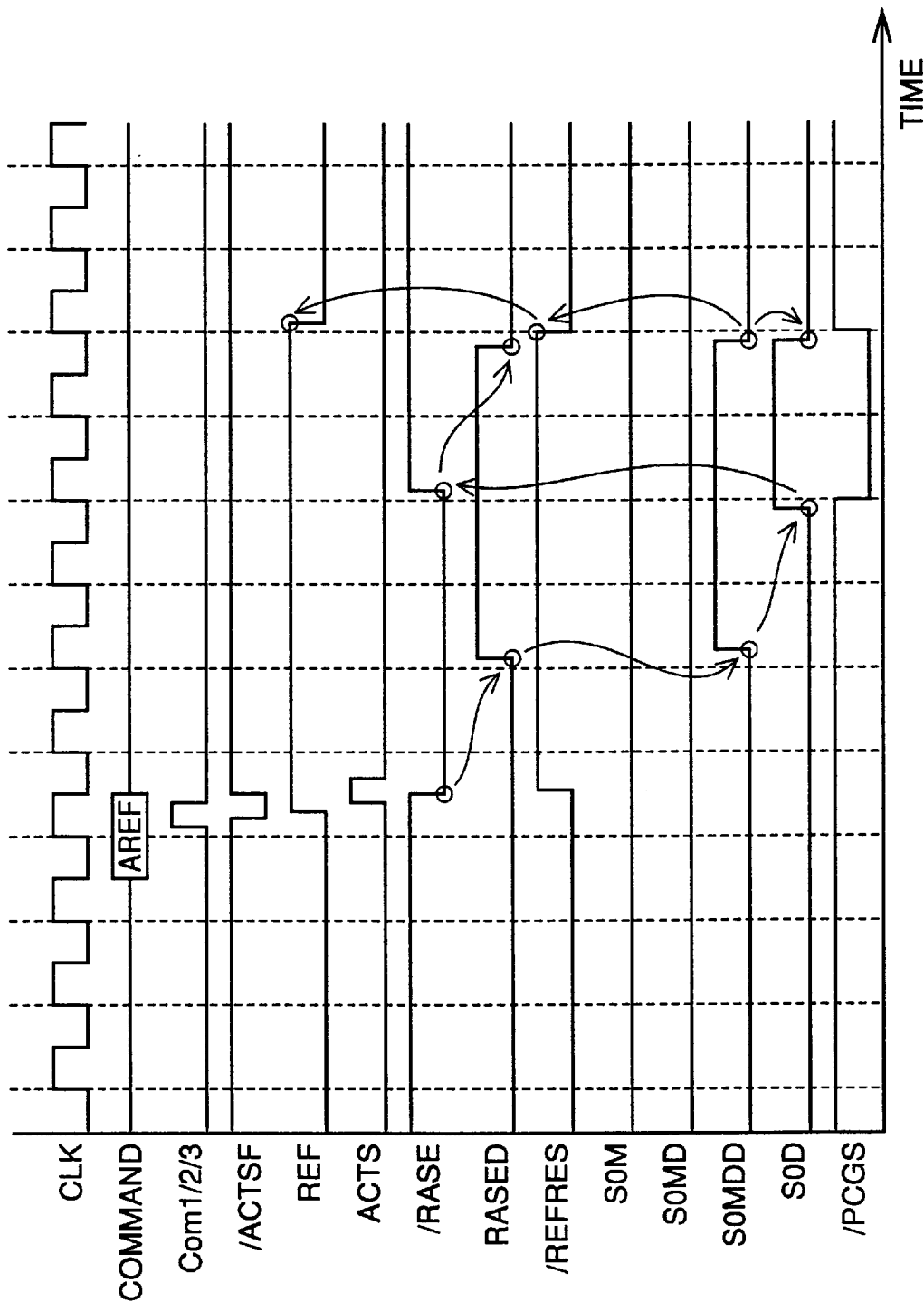
FIG. 24 is a waveform diagram representing a relation between the signals of global control circuit 330.

FIG. 24 is a waveform diagram representing a relation between the signals of global control circuit 330.

If the problem as described above is caused so that signal SOM for each memory cell array is maintained at an inactive low level and sense amplifier activation flag SOMD is fixed at an inactive low level, the operation of automatic reset timer circuit 60 allows the timing of a high-to-low transition of signal RASED to be provided as an output SOMDD from logic gate 61 to signal REF reset circuit 38.

Responsively, signal REF reset circuit 38 activates signal /REFRES. Thus, if only the global control circuit generates signal ACTS, ensuring that auto-refresh activation signal REF once activated is inactivated ensures that an auto-refresh operation completes.

Figure 25:
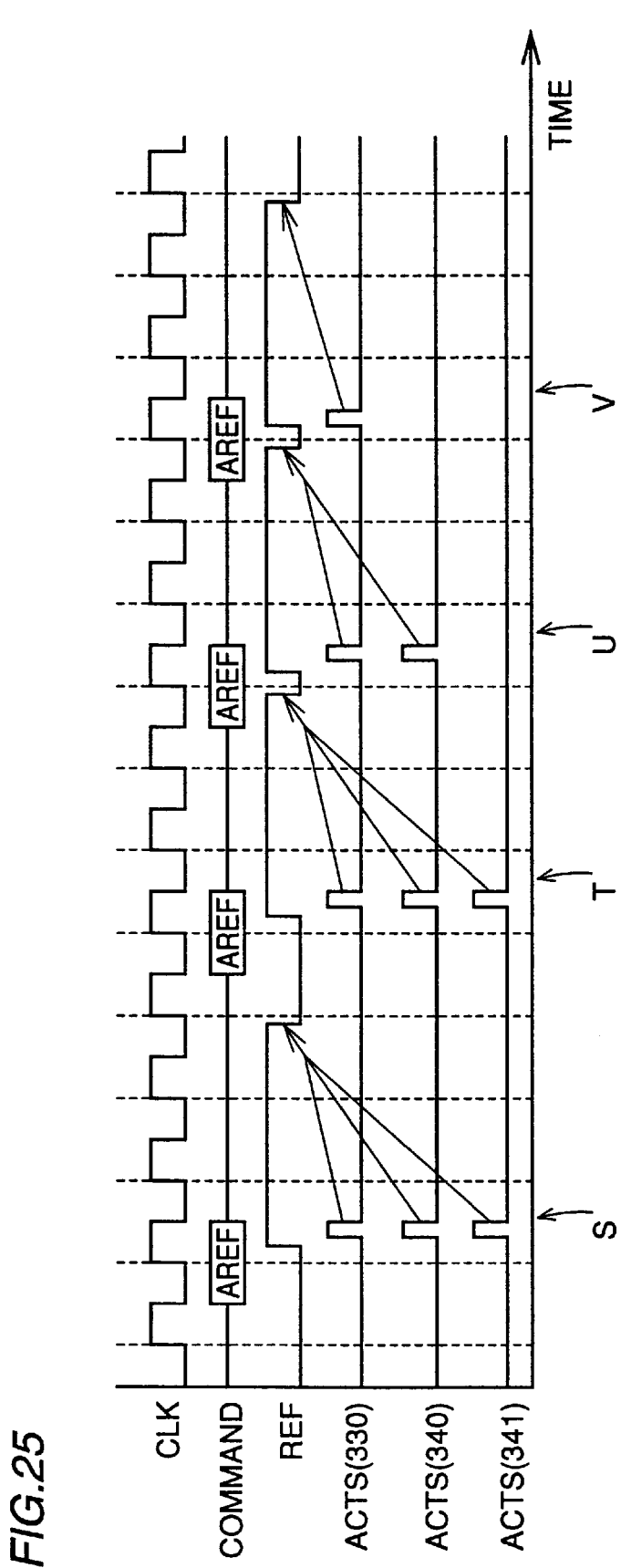
FIG. 25 is a view for representing a relation between signal REF and the generation of signal ACTS in each control circuit in the third embodiment.
Figure 26:
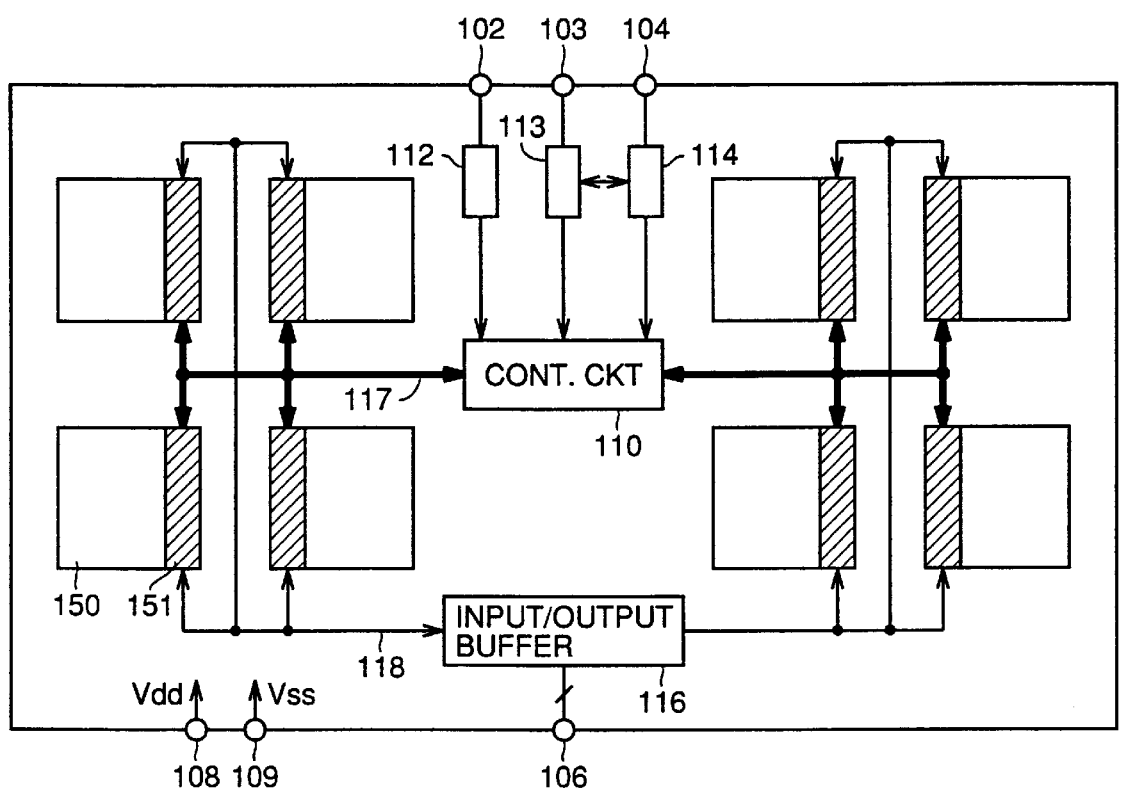
FIG. 26 shows a configuration of a conventional semiconductor memory device 100 having a plurality of memory cell arrays.

FIG. 25 is a view for representing a relation between signal REF and generation of signal ACTS in each control circuit in the third embodiment. In the figure, ACTS (330) represents signal ATCS generated in global control circuit 330 and ACTS (340) and ACTS (341) similarly represent signals ACTS generated in local control circuits 340 and 341, respectively.

In the third embodiment, as represented in FIG. 25, for a timing V, at which the global control circuit only generates signal ACTS, automatic reset timer circuit 60 ensures that auto-refresh activation signal REF is inactivated in response to signal ACTS generated in the global control circuit. Thus the general operation of the semiconductor memory device can further be stabilized.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory cell array divided into a first plurality of memory cell blocks;
   a plurality of local control circuits respectively provided for said memory cell blocks and controlling operations of corresponding memory blocks, each of said local control circuits activationg a command executon signal and executing an operation designated by a command activation signal on said corresponding memory cell block upon activation of said command activation signal, and inactivating said command execution signal in response to completion of said designated operation;
   a control signal bus for transmitting said command activation signal to said local control circuits and said command executions signals from said local control circuits; and
   a main control circuit, provided common to said first plurality of memory blocks, including
      a command producing circuit producing a predetermined command according to an external signal, and
      a global control circuit activation said command activation signal in response to said predetermined command, maintaining an active state of an auxiliary command signal for a first predetermined period of time, and inactivating said command activation signal in response to inactivation of said auxiliary command signal and said command execution signals from said local control circuits.

2. The semiconductor memory device according to claim 1, wherein:
   said command producing circuit produces a new command when said command activation signal is inactivated;
   said global control circuit generates a global command set trigger in response to a transition of said command activation signal from an inactive state to an active state and activates said auxiliary command signal for said first predetermined period of time since said global command set trigger is generated; and
   said local control circuit generates a local command set trigger in response to the activated command activation signal transmitted from said global control circuit and activates said command execution signal and effects said operation designated by said command activation signal in said corresponding memory cell block in response to the generated local command set trigger, and inactivates said command execution signal in response to completion of said designated operation.

3. The semiconductor memory device according to claim 2, wherein:
   said global control circuit has
   a first logic operation circuit receiving said command execution signals generated by said local control circuits and activating a command execution flag when any of input signals input thereto is in an active state,
   a delay circuit for receiving and delaying said command execution flag for a second predetermined period of time,
   a command decoder circuit receiving said predetermined command to generate a command generation pulse,
   a command reset circuit activating a command reset signal when said auxiliary command signal and said command execution flag are both inactivated,
   a command latch circuit activating said command activation signal in response to the generated command generation pulse, and maintaining the activated command activation signal while said command reset signal is in an inactive state,
   a global command set circuit detecting a transition of said command activation signal from an inactive state to an active state to generate the global command set trigger, and
   an auxiliary command signal generation circuit receiving said global command set trigger to activate said auxiliary command signal and inactivating said auxiliary command signal in response to an activated output signal from said delay circuit; and wherein
   each of said local control circuits has
   a local command set circuit detecting an inactive-to-active, transition of said command activation signal transmitted from said global control circuit to generate said local command set trigger, and
   a memory cell control circuit activating said command execution signal and effecting said operation designated by said command activation signal when a third predetermined period of time has elapsed since the generation of said local command set trigger, and inactivating said command execution signal in response to completion of said designated operation; and wherein
   said first predetermined period of time corresponds to a sum of said second and third predetermined periods of time.

4. The semiconductor memory device according to 3, wherein:
   said global control circuit generates said global command set trigger when said command activation signal is maintained in an inactive state for no less than a first inactive period and is then activated; and said local control circuit generates said local command set trigger when said command activation signal is maintained in an inactive state for a second inactive period longer than said first inactive period and is then activated.

5. The semiconductor memory device according to claim 3, wherein:

said global command set circuit includes a first auxiliary delay circuit receiving said command activation signal, delaying the received command activation signal for a first delay time and outputting the delayed command activation signal, said first auxiliary delay circuit including an inverter configured of a MOS transistor having a first channel length; and a first AND operation circuit outputting an AND of an output from said first auxiliary delay circuit and said command activation signal; and said local command set circuit includes a second auxiliary delay circuit receiving said command activation signal, delaying the received command activation signal for said first delay time and outputting the delayed command activation signal, said second auxiliary delay circuit including an inverter configured of a MOS transistor having a second channel length larger than said first channel length, and a second AND operation circuit outputting an AND of an output from said second auxiliary delay circuit and said command activation signal.

6. The semiconductor memory device according to claim 3, wherein:

said global command set circuit includes a third auxiliary delay circuit receiving said command activation signal, delaying the received command activation signal for a second delay time and outputting the delayed command activation signal, said third auxiliary delay circuit having inverters each configured of a MOS transistor and connected together in series, and a third AND operation circuit outputting an AND of an output from said third auxiliary delay circuit and said command activation signal; and said local command set circuit includes a fourth auxiliary delay circuit receiving said command activation signal, delaying the received command activation signal for said second delay time and outputting the delayed command activation signal, said fourth auxiliary delay circuit having inverters each configured of a MOS transistor and connected together in series, a ground interconnection supplying a ground potential, and a capacitor connected between an output terminal of one of said inverters and said ground interconnection, and a fourth AND operation circuit outputting an AND of an output from said fourth auxiliary delay circuit and said command activation signal.

7. The semiconductor memory device according to claim 1, wherein:

said global control circuit further includes an automatic reset timer circuit outputting an automatic reset signal obtained by delaying said auxiliary command signal for a third delay time; and said global control circuit inactivates said command activation signal in response to said command execution signal of each local control circuit, said auxiliary command signal and said automatic reset signal.

8. The semiconductor memory device according to claim 3, wherein:

said global control circuit further includes an automatic reset timer circuit outputting an automatic reset signal obtained by delaying said auxiliary command signal for a fourth delay time; and said first logic operation circuit also receives said automatic reset signals.

9. The semiconductor memory device according to claim 7, wherein said third delay time corresponds to said first predetermined period of time.

10. The semiconductor memory device according to claim 4, wherein:

said global control circuit further includes an automatic reset timer circuit outputting an automatic reset signal obtained by delaying said auxiliary command signal for a fifth delay time; and said command latch circuit inactivates said command activation signal in response to said command execution signal of each local control circuit, said auxiliary command signal and said automatic reset signals.

11. The semiconductor memory device according to claim 10, wherein said fifth delay time corresponds to said first predetermined period of time.

12. The semiconductor memory device according to claim 8, wherein:

said global command set circuit includes a first auxiliary delay circuit receiving said command activation signal, delaying the received command activation signal for a first delay time and outputting the delayed command activation signal, said first auxiliary delay circuit including an inverter configured of a MOS transistor having a first channel length, and a first AND operation circuit outputting an AND of an output from said first auxiliary delay circuit and said command activation signal; and said local command set circuit includes a second auxiliary delay circuit receiving said command activation signal, delaying the received command activation signal for said first delay time and outputting the delayed command activation signal, said second auxiliary delay circuit including an inverter configured of a MOS transistor having a second channel length larger than said first channel length, and a second AND operation circuit outputting an AND of an output from said second auxiliary delay circuit and said command activation signal.

13. The semiconductor memory device according to claim 6, said command latch circuit including a first auxiliary logical operation circuit, a fifth auxiliary delay circuit delaying an output from said first auxiliary logical operation circuit, a first SR flip-flop circuit receiving said command generation pulse as a set input and receiving an output from said fifth auxiliary delay circuit as a reset input, and a second SR flip-flop circuit outputting said command activation signal, said second SR flip-flop circuit receiving an inverted version of an output from said first SR flip-flop circuit as a set input and receiving said command reset signal as a reset input, wherein said first auxiliary logical operation circuit outputs a NAND of said command generation pulse and the output from said first SR flip-flop circuit.

14. The semiconductor memory device according to claim 13, wherein said command reset circuit includes a second auxiliary logical operation circuit outputting an OR of an inverted version of said auxiliary command signal and said command execution flag as said command reset signal.

* * * * *

UNITED STATES PATENT AND TRADEMARK OFFICE
CERTIFICATE OF CORRECTION

PATENT NO. : 5,986,964　　　　　　　　　　　　　　　　　Page 1 of 1
DATED : November 16, 1999
INVENTOR(S) : Takuya Ariki, et al.

It is certified that error appears in the above-identified patent and that said Letters Patent is hereby corrected as shown below:

In the Claims:
Column 18,
Claim 13, Line 46, change "6" to --3--.
Claim 14, Line 62, change "13" to --3--.

Signed and Sealed this

Nineteenth Day of June, 2001

Attest:

*Nicholas P. Godici*

NICHOLAS P. GODICI
*Attesting Officer*　　　*Acting Director of the United States Patent and Trademark Office*